United States Patent [19]
Mariani

[11] Patent Number: 5,113,115
[45] Date of Patent: May 12, 1992

[54] SAW SLANTED ARRAY CORRELATOR WITH AMPLITUDE ERROR COMPENSATING POLYMER REFLECTIVE ARRAY GRATING

[75] Inventor: Elio A. Mariani, Hamilton Square, N.J.

[73] Assignee: The United States of America as represented by the Secretary of the Army, Washington, D.C.

[21] Appl. No.: 717,576

[22] Filed: Jun. 19, 1991

[51] Int. Cl.$^5$ ............................................. H01L 41/08
[52] U.S. Cl. .................. 310/313 D; 333/153; 333/195
[58] Field of Search ............... 310/313 D; 333/153, 333/195

[56] References Cited

U.S. PATENT DOCUMENTS

| | | | |
|---|---|---|---|
| 3,753,164 | 8/1973 | DeVries | 310/313 D |
| 3,975,697 | 8/1976 | Paige | 310/313 D |
| 4,146,851 | 3/1979 | Dempsey et al. | 333/153 |
| 4,633,117 | 12/1986 | Bloch et al. | 310/313 D |
| 4,635,008 | 1/1987 | Solie | 310/313 D |
| 4,941,133 | 7/1990 | Mariani et al. | 310/313 D |

FOREIGN PATENT DOCUMENTS

| | | | |
|---|---|---|---|
| 0249790 | 9/1987 | Fed. Rep. of Germany | 310/313 D |
| 0180318 | 9/1985 | Japan | 333/195 |
| 0726646 | 4/1980 | U.S.S.R. | 310/313 D |

*Primary Examiner*—Mark O. Budd
*Assistant Examiner*—Thomas M. Dougherty
*Attorney, Agent, or Firm*—Michael Zelenka; Robert A. Maikis

[57] ABSTRACT

Amplitude error compensation is provided for a surface acoustic wave (SAW) slanted array correlator (SAC) device having an input interdigital dispersive slanted array transducer feeding a plurality of frequency dispersed SAW signals to an output interdigital dispersive slanted array transducer over a plurality of parallel, frequency dispersed first paths. A reflective array grating having a frequency and amplitude selective configuration is disposed between the input and the output transducers to reflect along a second path to an acoustic absorber a portion of the SAW signals sent from the input transducer to the output transducer. The second path is perpendicular to and traverses the plurality or first paths. The portion of the SAW signals reflected to the acoustic absorber are those SAW signals which when present in the output of the output transducer produce the unwanted amplitude errors. The reflective array grating is fabricated of a photosensitive polymer material so that the frequency and amplitude selective configuration of the grating may be obtained by using photolithographic techniques.

7 Claims, 2 Drawing Sheets

SAW SLANTED ARRAY CORRELATOR WITH AMPLITUDE ERROR COMPENSATING POLYMER REFLECTIVE ARRAY GRATING

GOVERNMENT INTEREST

The invention described herein may be manufactured, used and licensed by or for the Government for governmental purposes without the payment to me of any royalties thereon.

FIELD OF INVENTION

This invention relates to surface acoustic wave (SAW) devices and more particularly to a SAW slanted array correlator wherein unwanted time sidelobes or amplitude errors in the output of the correlator are minimized or eliminated by the use of a polymer reflective array grating.

DESCRIPTION OF THE PRIOR ART

SAW devices essentially convert input RF electric signals into surface acoustic waves (SAWs) for the purpose of signal processing or for obtaining a time delay, for example, and then reconvert the processed or delayed SAWs back into output RF electric signals. These devices are extremely useful because the very low velocity of acoustic waves relative to the velocity of electromagnetic waves makes it possible to produce relatively long electric signal time delays in a device having a very small physical size.

SAW slanted array correlators or compressors (SACs) are often used for bandwidth dispersive applications, such as pulse compression and chirp signal processing, for example. The SAW SAC devices used in these applications play an important role in modern compressive microscan receivers such as advanced military electronic intelligence receivers, for example, where the presence of amplitude error or ripple in the SAC output contribute to time sidelobes which adversely affect receiver dynamic range. Similarly, SAW SAC devices are also used in modern pulse compression radars where the presence of amplitude error in the SAC output will again contribute to time sidelobes which adversely affect the target resolution capability of the radar.

Unfortunately, several factors, such as production imperfections in the fabrication of the SAW SACs, for example, cause the SACs to have the unwanted amplitude errors or ripple in their output and thus to degrade their performance for the above-mentioned applications. At the present time, however, normal SAW SAC device operation does not employ any internal amplitude error compensation but only provides for phase error compensation by means of a thin metal phase plate or film which is patterned to compensation for the phase errors.

SUMMARY OF THE INVENTION

It is an object of this invention to provide a SAW SAC having internal amplitude error compensation means employing a polymer reflective array grating.

It is a further object of this invention to provide a SAW SAC having internal amplitude error compensation means which may be fabricated relatively simply and inexpensively using established manufacturing techniques.

It is a still further object of this invention to provide a SAW SAC having an amplitude error compensating polymer reflective array grating which may be patterned by using well known photolithographic techniques.

Briefly, the amplitude error compensated SAW SAC of the invention comprises a piezoelectric crystal substrate having a pair of oppositely disposed ends, a pair of oppositely disposed sides and a planar surface between the ends and between the sides. Input interdigital slanted array dispersive transducer means are disposed on the substrate surface adjacent one of the pair of substrate ends for propagating SAW signals along a plurality of frequency dispersed first paths on the substrate surface toward the other of the pair of substrate ends in response to an input RF signal applied to the transducer means. Output interdigital slanted array dispersive transducer means are disposed on the substrate surface adjacent the other substrate end for converting the SAW signals travelling along the plurality of first paths on the substrate surface from the input transducer means into an output RF signal. The output RF signal contains known amplitude errors at known frequencies. Acoustic absorber means are disposed on the substrate surface adjacent one of said pair of substrate sides between the input transducer means and the output transducer means for acoustically absorbing SAW signals travelling along a second path on the substrate surface from the other of said pair of substrate sides toward the one substrate side. The second path is disposed between the input transducer means and the output transducer means and is substantially perpendicular to and traversing the plurality of first paths. Dispersive reflective array grating means having a frequency and amplitude selective configuration are disposed along the second path on the substrate surface for reflecting along the second path toward the acoustic absorber means amplitude error compensation SAW signals selected from the SAW signals travelling along the plurality of first paths from the input transducer means toward the output transducer means. The amplitude error compensation SAW signals have amplitudes and frequencies which correct for the known amplitude errors at the known frequencies in the output RF signal when the amplitude error compensation SAW signals travelling along the second path are deleted from the SAW signals travelling along the plurality of first paths toward the output transducer means and fed to the acoustic absorber means. The reflective array grating means is a dispersive reflective array grating comprising a plurality of strip reflectors disposed on the surface of the substrate. Each of the plurality of strip reflectors is fabricated of a photosensitive polymer material.

The nature of the invention and other objects and additional advantages thereof will be more readily understood by those skilled in the art after consideration of the following detailed description taken in conjunction with the accompanying drawings.

DESCRIPTION OF THE PREFERRED EMBODIMENT OF THE INVENTION

Figure 1:
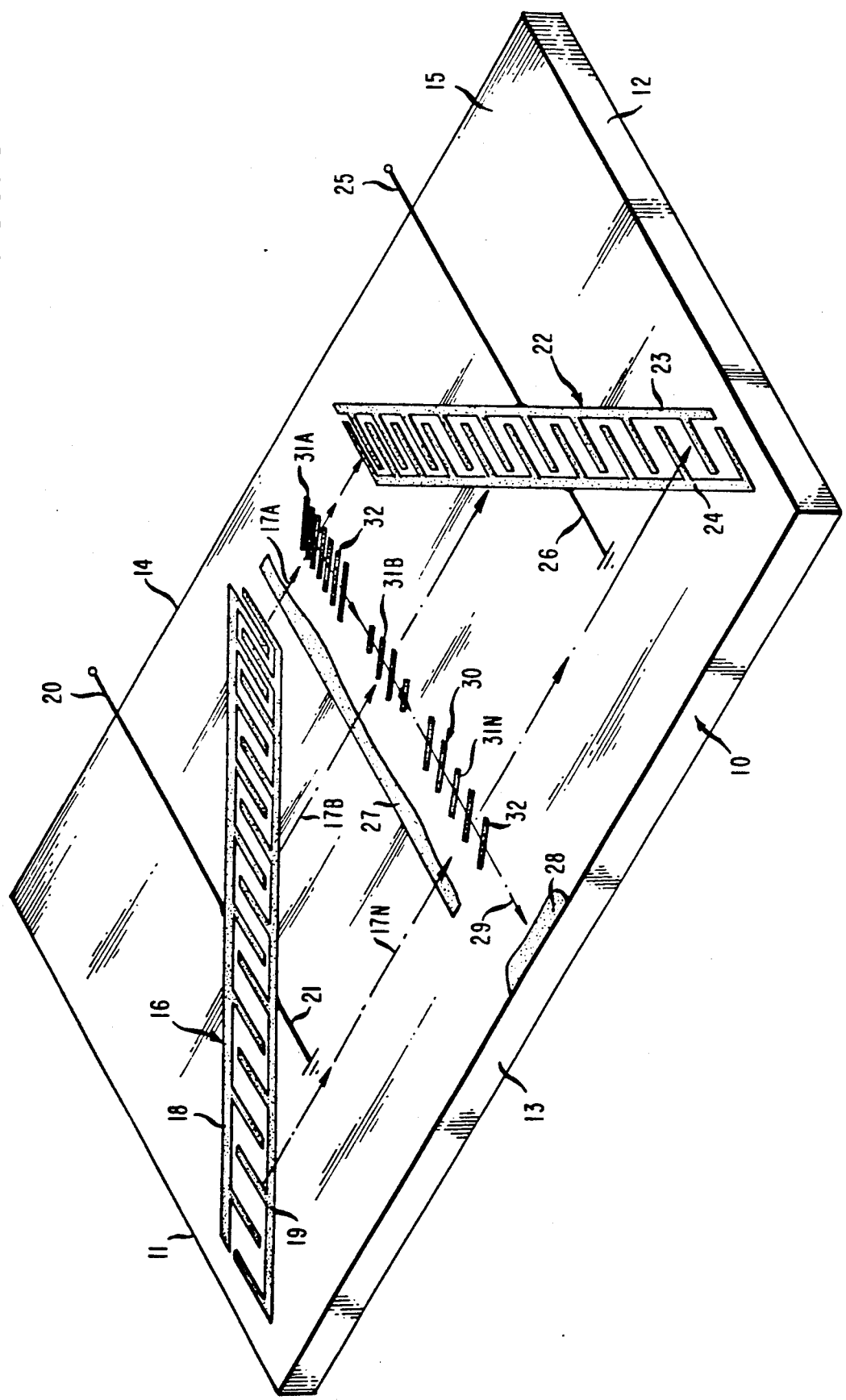
FIG. 1 is a schematic perspective view of the amplitude error compensated SAW SAC of the invention.

Referring now to FIG. 1 of the drawings, there is shown an amplitude error compensated SAW SAC constructed in accordance with the teachings of the present invention comprising a piezoelectric crystal substrate, indicated generally as 10, which has a pair of oppositely disposed ends 11 and 12, a pair of oppositely disposed sides 13 and 14 and a planar surface 15 between the ends 11 and 12 and between the sides 13 and 14. An input interdigital slanted array dispersive transducer, indicated generally as 16, is disposed on the substrate surface 15 adjacent the substrate end 11 and propagates SAW signals along a plurality of frequency dispersed first paths, indicated schematically by the dot-dash lines 17A, 17B-17N, on the substrate surface toward the other end 12 of the substrate in response to an input RF signal applied to the transducer means. The width of each of the paths 17A to 17N over which the SAW signals are transmitted is, of course, approximately the same width as the transducer 16 at that point along the length of the transducer. The transducer 16, as illustrated, is formed by two sets 18 and 19 of interleaved fingers and may comprise a thin film of aluminum or other conductive metal which is deposited on the surface 15 of the substrate in accordance with well known fabrication techniques. The input RF signal voltage is applied between the two interleaved sets 18 and 19 of fingers of the transducer by means of input leads 20 and 21 respectively. An output interdigital slanted array dispersive transducer, indicated generally as 22, is disposed on the substrate surface 15 adjacent the other substrate end 12 and serves to convert the SAW signals travelling along the plurality of first paths 17A through 17N from the substrate end 11 toward the substrate end 12 into an output RF signal which usually contains amplitude errors at certain frequencies. These amplitude errors and the frequencies at which they occur may be ascertained or become "known" from the RF signal output by means of amplitude vs. frequency tests which are well known in the art. The output transducer 22 is also formed by two sets 23 and 24 of interleaved fingers and is of the same construction as the input transducer 16 and may be fabricated in the same manner. The RF signal output appears between leads 25 and 26 which are coupled to the two sets 23 and 24 of interleaved fingers respectively.

Both the input and the output interdigital slanted array transducer means 16 and 22 are dispersive transducer means which means that the spacing between adjacent individual fingers in each set of fingers varies as a function of the distance of the finger from the end of the set of fingers, i.e., from the end of the substrate adjacent the end of the set of fingers, so that the plurality of first paths 17A through 17N are frequency dispersed. For example, with the array configuration illustrated, the frequency of the SAW signals reflected along the first path 17N, which is the path closest to the ends of the sets of fingers 18, 19 and to the adjacent end 11 of the substrate, would be lower than the frequency of the SAW signals reflected along the first paths 17B and 17A which are closer to the other ends of the sets of fingers 18, 19 and to the other end 12 of the substrate, so that the frequency of the propagated SAW signals would increase as a function of the distance of the first path from the substrate end 11.

A phase plate 27 which may comprise a thin film of aluminum or other conductive metal is formed on the surface 15 of the substrate between the input interdigital slanted array transducer 16 and the output interdigital slanted array transducer 22 and is patterned in accordance with well known techniques to compensate for phase errors appearing in the output RF signal from the output transducer 22. The phase plate 27, however, merely changes the propagation velocity of the SAW signals travelling along the first paths 17A through 17N and therefore will not compensate for amplitude errors which appear in the output RF signal from the transducer 22. The fabrication and operation of the SAW SAC thus far described is well known in the art and will not be described further herein except to note that the substrate 10 is usually made of a piezoelectric material such as quartz or lithium niobate, for example.

The SAW SAC of the invention also provides internal amplitude error compensation by means which will now be described. As seen in FIG. 1, acoustic absorber means 28 are disposed on the surface 15 of the substrate 10 adjacent the substrate side 13. The acoustic absorber means 28 are disposed between the input interdigital transducer means 16 and the output interdigital transducer means 22 and serve to acoustically absorb SAW signals travelling along a second path 29 on the substrate surface 15 from the other substrate side 14 toward the substrate side 13. It will be noted that the second path 29 is disposed between the input transducer means 16 and the output transducer means 22 and is substantially perpendicular to and traverses the paths 17A through 17N. In practice, the acoustic absorber means may comprise an area of acoustically absorbing material such as rubber cement, silicone adhesive or wax, for example, which is deposited on the substrate surface 15.

The SAW SAC of the invention also comprises dispersive reflective array grating means, indicated generally as 30, which are disposed along the second path 29 on the substrate surface 15. The dispersive reflective array grating means 30 has a frequency and amplitude selective configuration formed by a plurality of discreet packets 31A, 31B-31N which are each composed of varying numbers of individual strip reflectors 32. The reflectors in each of the packets 31A through 31N should have the same periodicity as the fingers in the set of fingers 18, 19, 23 and 24 of the input and output interdigital transducers 16 and 22. The function of this reflective array grating 30 is to reflect along the second path 29 toward the acoustic absorber means 28 amplitude error compensation SAW signals which are selected from the SAW signals travelling along the plurality of frequency dispersed first paths 17A through 17N from the input transducer means 16 to the output transducer means 22. The amplitude error compensation SAW signals which are reflected along the second path 29 by the array grating 30 have amplitudes and frequencies which correct for the known amplitude errors at the known frequencies in the output RF signal from output transducer 22 when the amplitude error compensation SAW signals travelling along the second path 29 are deleted from the SAW signals travelling along the plurality of first paths 17A through 17N and fed to the acoustic absorber means 28 where they are harmlessly absorbed.

In accordance with the invention, the dispersive reflective array grating 30 is formed by strip reflectors 32 which are fabricated of a photosensitive polymer material. The term "photosensitive polymer material" as used herein denotes a polymer material such as polyimide or a polymer photoresist material such as polymethylmethacrylate which is easily patterned or shaped by making use of known photolithographic techniques. The individual strip reflectors 32 of the array grating 30 would have a uniform thickness, i.e. height as measured from the substrate surface 15, and would be disposed in the discreet packets 31A through 31N which form the array grating. The discreet packets 31A through 31N of reflectors in the array grating 30 are located at those spatial positions or selected points along the length of the second path 29 which correspond to the SAW signal frequencies responsible for the known amplitude errors at the known frequencies in the output RF signal from the output transducer 22. These selected points or spatial locations would be at frequencies where the insertion loss of the SAW device was maximum, i.e., regions of maximum amplitude vs. frequency response. The number of reflectors in each of the plurality of discreet packets of reflectors 31A through 31N may be selectively varied to control both the amplitudes and frequencies of the second path amplitude error compensation SAW signals which are deleted from the normal SAC output SAW signals travelling along the plurality of first paths 17A to 17N to the output transducer 22. Similarly, the shape of the "envelope" of each of the plurality of discreet packets of reflectors 31A through 31N may be selectively varied to effect a finer or "vernier" adjustment of amplitudes and frequencies of the amplitude error compensation SAW signals. The shape of the envelope of a packet of reflectors may be controlled by selectively varying the lengths of the individual strip reflectors 32 forming that particular packet. For example, in packet 31B of the array configuration shown in FIG. 1, the envelope shape is somewhat elliptical because the first and the last reflectors in the packet are shorter in length than the two center reflector strips.

The amplitude error compensated SAW SAC device of the invention may be fabricated in the following manner. When the transducers 16 and 22 and the phase plate 27 are formed on the substrate surface 15, the acoustic absorber 28 may be formed on the surface 15 of the substrate together with a linearly dispersive array of the polymer reflector strips 32 of the reflective array grating 30. The array grating 30 at this time would have exactly the periodicity and dispersive characteristic as the input and output transducers 16 and 22 and would not be divided into the discreet groups or packets of reflectors 31A through 31N. The preliminary amplitude vs. frequency tests would then be made and the polymer reflector strips of the array grating 30 would be selectively removed using photolithographic techniques leaving behind only the desired packets and configurations of packets needed to effect the amplitude error compensation. Although it is possible to fabricate the SAW SAC of the invention by performing the amplitude vs. frequency tests before the reflective array grating 30 is placed on the substrate surface 15 and then to place the desired number of packets and packet configurations at the desired points along the length of the second path 29 in the array grating until any amplitude errors appearing in the output of the SAW SAC device were eliminated or minimized to a satisfactory point, the most practical and straight-forward way would appear to be to place the entire complete array grating on the substrate and then to selectively remove individual reflector strips as needed to form the desired number of packets and packet shapes. By fabricating the reflective array grating 30 from reflector strips made of a photosensitive polymer material, the aforementioned well known photolithographic techniques may be readily and inexpensively employed to create the amplitude error compensation desired.

Figure 2:
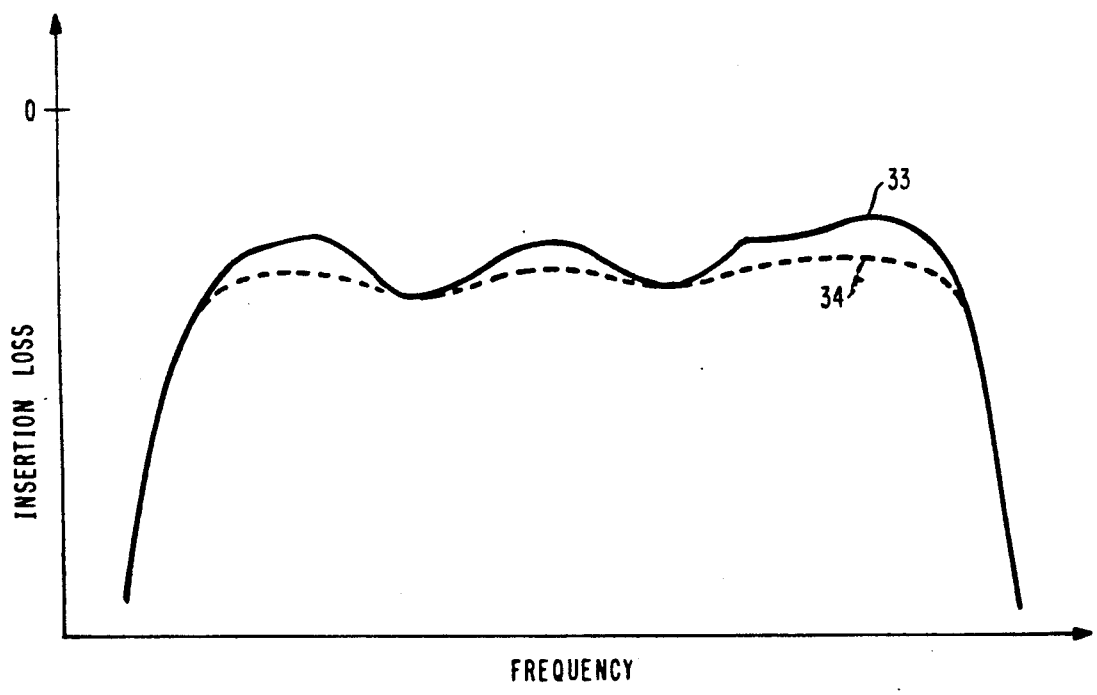
FIG. 2 is a graphical representation showing the insertion loss as a function of frequency for both amplitude error compensated SAW SACs and uncompensated SAW SACs.

FIG. 2 of the drawings is a graphical representation showing insertion loss of a SAW SAC device as a function of frequency over the operating frequency bandwidth of the device. Curve 33 shows the response of a SAW SAC which does not have amplitude error compensation while curve 34 shows the response of an amplitude error compensated SAW SAC device. From an inspection of FIG. 2, it will be noted that curve 34 is much flatter than curve 33 over the operating frequency bandwidth of the device showing that the unwanted fluctuations in insertion loss which represent the unwanted amplitude errors or ripples are effectively minimized or eliminated.

It is believed apparent that many changes could be made in the construction and described uses of the foregoing amplitude error compensated SAW SAC and many seemingly different embodiments of the invention could be constructed without departing from the scope thereof. Accordingly, it is intended that all matter contained in the above description or shown in the accompanying drawings shall be interpreted as illustrative and not in a limiting sense.

What is claimed is:

1. An amplitude error compensated SAW slanted array correlator comprising:

a piezoelectric crystal substrate having a pair of oppositely disposed ends, a pair of oppositely disposed sides and a planar surface between said ends and between said sides;

input interdigital slanted array dispersive transducer means disposed on said substrate surface adjacent one of said pair of substrate ends for propagating SAW signals along a plurality of frequency dispersed first paths on said substrate surface toward the other of said pair of substrate ends in response to an input RF signal applied to said transducer means;

output interdigital slanted array dispersive transducer means disposed on said substrate surface adjacent said other substrate end for converting the SAW signals travelling along said plurality of first paths on said substrate surface from said input transducer means into an output RF signal, said output RF signal containing known amplitude errors at known frequencies;

acoustic absorber means disposed on said substrate surface adjacent one of said pair of substrate sides between said input transducer means and said output transducer means for acoustically absorbing SAW signals travelling along a second path on said substrate surface from the other of said pair of substrate sides toward said one substrate side, said second path being disposed between said input transducer means and said output transducer means and being substantially perpendicular to and traversing said plurality of first paths; and dispersive reflective array grating means having a frequency and amplitude selective configuration disposed along said second path on said substrate surface for reflecting along said second path toward said acoustic absorber means amplitude error compensation SAW signals selected from said SAW signals travelling along said plurality of first paths from said input transducer means toward said output transducer means, said amplitude error compensation SAW signals having amplitudes and frequencies which correct for said known amplitude errors at said known frequencies in said output RF signal when said amplitude error compensation SAW signals travelling along said second path are deleted from said SAW signals travelling along said plurality of first paths toward said output transducer means and fed to said acoustic absorber means, said reflective array grating means being a dispersive reflective array grating comprising a plurality of strip reflectors disposed on said surface of said substrate, each of said plurality of strip reflectors being fabricated of a photosensitive polymer material.

2. An amplitude error compensated SAW slanted array correlator as claimed in claim 1
wherein said input interdigital slanted array dispersive transducer means and said output interdigital slanted array dispersive transducer means are linearly dispersive slanted array transducer means and said reflective array grating is a linearly dispersive reflective array grating,
wherein said input interdigital slanted array dispersive transducer means, said output interdigital slanted array dispersive transducer means and said dispersive reflective array grating all have the same periodicity and
wherein said frequency and amplitude selective configuration of said dispersive reflective array grating comprises a plurality of discrete packets of reflectors disposed at selected points along said second path, said selected points being at SAW signal frequencies responsible for said known amplitude errors at said known frequencies in said output RF signal.

3. An amplitude error compensated SAW slanted array correlator as claimed in claim 2 wherein said photosensitive polymer material is polyimide.

4. An amplitude error compensated SAW slanted array correlator as claimed in claim 2 wherein said photosensitive polymer material is a photoresist material.

5. An amplitude error compensated SAW slanted array correlator as claimed in claim 4 wherein said photoresist material is polymethylmethacrylate.

6. An amplitude error compensated SAW slanted array correlator as claimed in claim 2 wherein the number of reflectors in each of said plurality of discrete packets of reflectors is selectively varied to control the amplitudes and frequencies of said second path amplitude error compensation SAW signals.

7. An amplitude error compensated SAW slanted array correlator as claimed in claim 2 wherein the shape of the envelope of at least one of said plurality of discrete packets of reflectors is selectively varied by selectively controlling the lengths of the reflectors in said one packet to control the amplitudes and frequencies of said second path amplitude error compensation SAW signals.

* * * * *